US008013611B2

(12) United States Patent
Elder et al.

(10) Patent No.: US 8,013,611 B2
(45) Date of Patent: Sep. 6, 2011

(54) VEHICLE BATTERY PRODUCT AND BATTERY MONITORING SYSTEM

(75) Inventors: David Elder, Margate, FL (US); Frank Bruno, Lake Worth, FL (US)

(73) Assignee: Reserve Power Cell, LLC, Deerfield Beach, FL (US)

( * ) Notice: Subject to any disclaimer, the term of this patent is extended or adjusted under 35 U.S.C. 154(b) by 918 days.

(21) Appl. No.: 11/486,101

(22) Filed: Jul. 14, 2006

(65) Prior Publication Data

US 2007/0229032 A1   Oct. 4, 2007

Related U.S. Application Data

(63) Continuation-in-part of application No. 11/392,620, filed on Sep. 11, 2006, now Pat. No. 7,598,700.

(51) Int. Cl.
G01N 27/416 (2006.01)
H02J 7/00 (2006.01)

(52) U.S. Cl. .................................. 324/427; 320/127

(58) Field of Classification Search .............. 320/106, 320/127, 132, 152, 162, 164; 324/425, 426, 324/429, 433, 434, 427; 340/636.1, 636.12, 340/636.13, 636.15, 636.18, 636.2
See application file for complete search history.

(56) References Cited

U.S. PATENT DOCUMENTS

| 1,588,803 | A | 6/1928 | Owen |
| 3,029,301 | A | 4/1962 | Strider |
| 3,200,014 | A | 8/1965 | Roberts |
| 3,475,221 | A | 11/1969 | Jordan et al. |
| 3,742,302 | A | 6/1973 | Neill |
| 3,758,345 | A | 9/1973 | Toth et al. |
| 3,763,415 | A | 10/1973 | Ownby |

(Continued)

FOREIGN PATENT DOCUMENTS

DE    3502100 A1    7/1986

(Continued)

OTHER PUBLICATIONS

Hardin, Je, Laboratory Testing of GNB Switch 12 Volt SLI Battery, Mar. 1990, pp. 1-16, US Department of Commerce, National Technical Information Service, Springfield, VA.

(Continued)

*Primary Examiner* — Richard V Muralidar
(74) *Attorney, Agent, or Firm* — Tangent Law Group, PLLC; Eric J. Weierstall, Esq.

(57) ABSTRACT

A vehicle battery product and a battery monitoring system communicating with a battery product having an at least one electronics module, the module having a controller, the controller having software and a computer readable storage media. An at least one sensor circuit senses the status of the battery product including a battery product voltage and a battery product temperature. Software modules in the battery monitoring system acquire battery product data such as the battery product voltage and the battery product temperature, filter the acquired battery product data into modified battery product data and process the modified battery product data against stored parameters through a lookup function on a variable event filter table resulting in an output that represents the state of charge or state of health of the battery. The acquired, filtered, modified and compared battery product data is stored to provide historical battery product data over the course of the life of the battery product. This stored battery product data is compared against threshold levels. An at least one communication device communicates the data from the battery product and to the battery product and from and to the battery monitoring system to communicate the condition of the battery to a user.

17 Claims, 5 Drawing Sheets

U.S. PATENT DOCUMENTS

| | | | |
|---|---|---|---|
| 3,949,289 A | 4/1976 | Day | |
| 4,041,363 A | 8/1977 | Scheidler | |
| 4,082,992 A | 4/1978 | Day | |
| 4,090,122 A | 5/1978 | Hoinski | |
| 4,157,492 A | 6/1979 | Colbrese | |
| 4,239,839 A | 12/1980 | McDowall et al. | |
| 4,264,855 A | 4/1981 | Ghibaudo et al. | |
| 4,489,242 A | 12/1984 | Worst | |
| 4,516,066 A | 5/1985 | Nowakowski | |
| 4,684,580 A | 8/1987 | Cramer | |
| 4,746,853 A | 5/1988 | Ingalls | |
| 4,869,688 A | 9/1989 | Merio | |
| 4,883,728 A | 11/1989 | Witehira | |
| 4,924,176 A | 5/1990 | Tremblay | |
| 4,949,028 A | 8/1990 | Brune | |
| 5,002,840 A | 3/1991 | Klebenow et al. | |
| 5,108,848 A | 4/1992 | Kramer | |
| 5,154,985 A | 10/1992 | Tanaka | |
| 5,157,271 A | 10/1992 | Fujiwara | |
| 5,162,164 A | 11/1992 | Dougherty et al. | |
| 5,164,273 A | 11/1992 | Szasz et al. | |
| 5,169,735 A | 12/1992 | Witehira | |
| 5,175,484 A | 12/1992 | Witehira et al. | |
| 5,194,799 A | 3/1993 | Tomantschger | |
| 5,200,688 A | 4/1993 | Patino et al. | |
| 5,204,610 A | 4/1993 | Pierson et al. | |
| 5,223,351 A | 6/1993 | Wruck | |
| 5,225,761 A | 7/1993 | Albright | |
| 5,251,179 A * | 10/1993 | Wittman | 365/227 |
| 5,256,502 A | 10/1993 | Kump | |
| 5,264,777 A | 11/1993 | Smead | |
| 5,316,868 A | 5/1994 | Dougherty et al. | |
| 5,352,966 A | 10/1994 | Irons | |
| 5,418,444 A | 5/1995 | Cook et al. | |
| 5,448,152 A | 9/1995 | Albright et al. | |
| 5,487,956 A | 1/1996 | Bromley et al. | |
| 5,496,654 A | 3/1996 | Perkins | |
| 5,534,765 A | 7/1996 | Kreisinger et al. | |
| 5,549,984 A | 8/1996 | Dougherty | |
| 5,576,612 A | 11/1996 | Garret et al. | |
| 5,606,242 A | 2/1997 | Hull et al. | |
| 5,666,040 A * | 9/1997 | Bourbeau | 320/118 |
| 5,683,827 A | 11/1997 | Yu | |
| 5,691,621 A | 11/1997 | Phuoc et al. | |
| 5,694,335 A | 12/1997 | Hollenberg | |
| 5,728,553 A | 3/1998 | Waugh | |
| 5,767,658 A | 6/1998 | Hayes | |
| 5,825,100 A | 10/1998 | Kim | |
| 5,838,136 A | 11/1998 | Waugh | |
| 5,844,325 A | 12/1998 | Waugh et al. | |
| 5,866,274 A | 2/1999 | Mawston et al. | |
| 5,883,496 A | 3/1999 | Esaki et al. | |
| 5,907,194 A | 5/1999 | Schenk et al. | |
| 5,986,431 A | 11/1999 | Hayes | |
| 5,993,983 A | 11/1999 | Rozon | |
| 5,995,396 A | 11/1999 | Byrne et al. | |
| 6,005,367 A * | 12/1999 | Rohde | 320/106 |
| 6,046,514 A | 4/2000 | Rouillard et al. | |
| 6,051,976 A | 4/2000 | Bertness | |
| 6,057,666 A | 5/2000 | Dougherty et al. | |
| 6,072,299 A | 6/2000 | Kurle et al. | |
| 6,104,967 A | 8/2000 | Hagen et al. | |
| 6,121,750 A | 9/2000 | Hwa et al. | |
| 6,172,478 B1 | 1/2001 | Leppo et al. | |
| 6,181,100 B1 | 1/2001 | Shoji | |
| 6,198,249 B1 | 3/2001 | Kroll et al. | |
| 6,222,341 B1 | 4/2001 | Dougherty et al. | |
| 6,222,342 B1 | 4/2001 | Eggert et al. | |
| 6,229,279 B1 | 5/2001 | Dierker | |
| 6,271,642 B1 | 8/2001 | Dougherty et al. | |
| 6,275,001 B1 | 8/2001 | Dierker | |
| 6,291,966 B1 | 9/2001 | Wendelrup et al. | |
| 6,320,351 B1 | 11/2001 | Ng et al. | |
| 6,323,608 B1 | 11/2001 | Ozawa | |
| 6,377,029 B1 | 4/2002 | Krieger et al. | |
| 6,384,573 B1 | 5/2002 | Dunn | |
| 6,452,361 B2 | 9/2002 | Dougherty et al. | |
| 6,455,951 B1 | 9/2002 | Shultz et al. | |
| 6,456,036 B1 * | 9/2002 | Thandiwe | 320/106 |
| 6,476,583 B2 | 11/2002 | McAndrews | |
| 6,507,169 B1 | 1/2003 | Holtom et al. | |
| 6,515,453 B2 | 2/2003 | Feil et al. | |
| 6,545,445 B1 | 4/2003 | McDermott et al. | |
| 6,577,098 B2 | 6/2003 | Griffey et al. | |
| 6,597,150 B1 | 7/2003 | Bertness et al. | |
| 6,639,384 B2 | 10/2003 | Hasegawa et al. | |
| 6,727,602 B2 | 4/2004 | Olson | |
| 6,734,651 B2 | 5/2004 | Cook et al. | |
| 6,784,637 B2 | 8/2004 | Raichle et al. | |
| 6,795,782 B2 * | 9/2004 | Bertness et al. | 702/63 |
| 6,832,171 B2 | 12/2004 | Barsoukov et al. | |
| 6,871,151 B2 | 3/2005 | Bertness | |
| 6,923,279 B2 | 8/2005 | Shimane et al. | |
| 6,936,934 B2 | 8/2005 | Morimoto et al. | |
| 6,989,748 B2 | 1/2006 | Rabanne et al. | |
| 7,003,411 B2 * | 2/2006 | Bertness | 702/63 |
| 7,042,115 B2 | 5/2006 | Mizutani et al. | |
| 7,058,525 B2 | 6/2006 | Bertness et al. | |
| 7,129,706 B2 * | 10/2006 | Kalley | 324/426 |
| 7,317,995 B2 * | 1/2008 | Quint et al. | 702/63 |
| 7,498,767 B2 * | 3/2009 | Brown et al. | 320/107 |
| 2001/0035732 A1 | 11/2001 | Sakakibara | |
| 2002/0105443 A1 | 8/2002 | Flick | |
| 2002/0125858 A1 | 9/2002 | Kuo et al. | |
| 2002/0138772 A1 | 9/2002 | Crawford et al. | |
| 2003/0062773 A1 | 4/2003 | Richter et al. | |
| 2003/0137277 A1 | 7/2003 | Mori et al. | |
| 2003/0169019 A1 | 9/2003 | Oosaki | |
| 2003/0197512 A1 | 10/2003 | Miller et al. | |
| 2004/0078141 A1 | 4/2004 | Kittell et al. | |
| 2004/0113589 A1 | 6/2004 | Crisp et al. | |
| 2004/0192407 A1 | 9/2004 | Formenti | |
| 2005/0024061 A1 | 2/2005 | Cox et al. | |
| 2005/0027466 A1 | 2/2005 | Steinmetz et al. | |
| 2005/0038614 A1 | 2/2005 | Botts et al. | |
| 2005/0134225 A1 | 6/2005 | Mese et al. | |
| 2005/0149280 A1 | 7/2005 | Sharma et al. | |
| 2005/0234663 A1 | 10/2005 | Quint et al. | |
| 2006/0006876 A1 | 1/2006 | Bertness | |
| 2006/0284600 A1 | 12/2006 | Verbrugge | |
| 2007/0159137 A1 | 6/2007 | Verbrugge et al. | |
| 2007/0285060 A1 | 12/2007 | Zettel et al. | |

FOREIGN PATENT DOCUMENTS

| | | | |
|---|---|---|---|
| DE | 3502100 A1 | 7/1986 |
| EP | 1355401 A2 | 10/2003 |
| GB | 2040117 A | 8/1980 |
| GB | 2220112 | 12/1989 |
| GB | 2373648 A | 9/2002 |
| JP | 05068306 A | 3/1993 |
| JP | 2001021974 A | 1/2001 |
| WO | 42786 A2 | 5/2002 |
| WO | WO/42786 A2 | 5/2002 |
| WO | WO200706121 | 4/2005 |
| WO | 200706121 | 4/2006 |

OTHER PUBLICATIONS

Halverson, Richard C., Neon Colors Jazz Up APAA Show 'Spare' Batteries Spark Interest Despite High Prices, Sep. 25, 1989, Discount Store News (via www.findartiles.com).

Unknown, 'Spare' Battery Prices Ease at Discounters, Jan. 29,1990, Discount Store News (reprinted at www.findarticles.com).

Pacific Dunlop of Australia, Exide Switch Battery "The others look half as good", Jul. 3, 1989, pp. 1-2 .

Patent Office of the People's Republic of China; Notification and English translation of a First Office Action dated Oct. 10, 2008 in connection with Chinese Application No. 200480026280.8 entitled "Multiple Battery System Management System, Auxiliary Battery Attachment System" (5 pages), which is a Chinese counterpart application to parent U.S. Appl. No. 10/604,703.

Patent Office of the People's Republic of China; Notification and English translation of a Second Office Action dated May 8, 2009 in connection with Chinese Application No. 200480026280.8 entitled "Multiple Battery System Management System, Auxiliary Battery Attachment System" (5 pages), which is a Chinese counterpart application to parent US Appl. No. 10/604,703.

SAFT/VALEO Power Point Presentation "Ni-MH/Lead Acid dual battery system: A reliable solution for energy demanding vehicles", presented at the Advanced Battery Conference, Jul. 13, 2004.

"Revolutionary New 'Intelligent Dual Battery System' Introduced to Market". Press Release, Reeves Laverdure, Aug. 26, 2004.

"RPC Intelligent Dual Battery System", Advanced Battery Technology, Sep. 2004, vol. 40: No. 9, p. 18.

"Dual Battery Always Delivers", Battery & EV Technology, Aug. 2004.

"New Intelligent Dual Battery System Introduced into the Market", Battery Power Products & Tehnology, Spe. 2004, vol. 8, Issue 5.

Schmidt, et al: "Complex Impedance Studies of Lithium Iodine Batteries", Aerospace and Electronic Systems Magazine, IEEE, Aug. 1990, vol. 5, Issue 8, pp. 7-12.

Rong, et al: "an Analytical Model for Predicting the Remaining Battery Capacity of Lithium for Batteries". Proceedings of the Design. Automation and Test in Europe Conference and Exhibition. 2003, pp. 1148-1149.

\* cited by examiner

VEHICLE BATTERY PRODUCT AND BATTERY MONITORING SYSTEM

CROSS-REFERENCE TO RELATED APPLICATIONS

This application is a continuation-in-part of U.S. patent application Ser. No. 11/392,620, filed Sept. 11, 2006, now U.S. Pat. No. 7,598,700 which is incorporated herein by reference.

FIELD OF THE INVENTION

The invention relates to a method, article of manufacture, and a system for tracking and monitoring warranty and/or performance information for batteries, more specifically to a system having an electronics module and storage media with an at least one sensor circuit sensing the parameter of the battery product and an at least controller that analyzes the data to establish the condition of the battery.

BACKGROUND OF THE INVENTION

The automotive industry has been one of the leading innovators in the world throughout the last hundred years. As a leader in advanced technologies, automakers have consistently incorporated state of the art technology into the vehicles we drive. From the analog world of the early twentieth century, the automobiles of today have increasingly incorporated high technology electronics to provide enhanced functionality, ease of use, and ease of maintenance.

However, current battery technologies have lagged far behind this modernization curve. Little impetus has been provided to improve battery technologies beyond advancing some of the chemistry and physical properties within the battery. Nonetheless, as the myriad of technological advances have been incorporated into automobiles, the need for reliable electrical power has also increased—and the battery remains at the heart of providing that power. To supply that power in a more reliable fashion, innovative smart batteries and smart multiple battery systems have been or are being developed by automakers and battery manufacturers alike.

Devices like U.S. Patent Application No. 2005/0038614 Botts et al. shows a remote battery monitoring system and sensors in which a plurality of telesensors are connected to batteries in a battery string. The telesensors measure battery data such as voltage, current, and temperature and wirelessly transmit the battery data to a control and collection unit. The control and collection unit receives, processes, analyzes, and stores the battery data. Remote monitoring software running on the control and collection unit can be configured to provide warning alarms when the battery data is outside present limits.

Another example is U.S. Pat. No. 6,456,036 to Thandiwe, which provides for a smart battery that has a network communication interface such that the battery can send and receive battery-related data. The battery is in conductive and communicative interface with a device, such as a cellular telephone, personal digital assistant (PDA), or laptop computer, which has a network communication pathway that the battery uses for data exchange. The smart battery can alternately be in conductive and communicative interface with a charger that is interfaced with a computer, and the charger selectively establishes a network communication pathway through the charger-computer interface for the smart battery to exchange data across the network. However, the system does not provide for the communication of information exchanged with the network to include storage of battery historic information, such as warranty activation/validation data and/or warranty invalidating performance information, or for the selective enablement of the battery or features of or on the battery.

Similarly, U.S. Patent Application Publication No. 2003/0197512 to Miller et al. shows a battery analyzer configured to communicatively couple to a computer network in which a processing arrangement is configured to charge and discharge the battery of each of an at least one battery arrangement via a battery interface arrangement and is configured to initiate a performance sequence. Data communication between the battery analyzer and a customer service site is illustrated in and can include for example, usage, performance, and/or technical support information of the battery arrangement to the customer service site via the computer network. The centralized computer system may store the information in a memory unit for subsequent retrieval, for example, to graph the usage and performance information and/or to perform numerical analysis on the usage and performance information. However, again, no warranty information is stored, treated, or communicated between the battery analyzer of Miller, et al., nor is there any discussion of the enablement or selective activation or deactivation of features on or in the battery.

These improved technologies come with ever increasing costs to both the customer and the manufacturer. As the batteries become more advanced, the replacement costs for meeting warranty obligations for manufacturers increases. Moreover, the cost of recalls and failures in designs that might reduce battery life make this replacement cost even greater. Additionally, smart batteries will increasingly provide a wider and wider range of functionality and become more feature rich. A system for providing control over the software and hardware enablement of the batteries is needed. Additionally, reliability and replacement for these batteries becomes increasingly important as the vehicles that utilize this power also become more feature rich.

Therefore, there exists a need to provide a system whereby information can be programmed into a smart battery and this information can be centrally stored for use by maintenance providers and manufacturers.

There exists a further need to provide an onboard programmable component of a smart battery that is capable of both receiving data at point of sale, receiving and reporting data during use, and while receiving maintenance, while also allowing for communication of this data to a centralized data network. Additionally, in receiving this data, the smart battery can be capable of disabling and/or enabling both software and hardware on the battery and reporting an estimate as to the remaining useful life of the battery.

SUMMARY OF THE INVENTION

An object of the invention is to provide a smart battery together with a warranty and metrics tracking system whereby information can be programmed into a smart battery and, at the same time, that information can be centrally stored for use by maintenance providers and manufacturers.

An object of the invention is to an onboard programmable component of a smart battery that is capable of both receiving data at point of sale, during operation, and while receiving maintenance while also allowing for communication of this data to a centralized data network. Additionally, in receiving this data, the smart battery can be capable of disabling and/or enabling both software and hardware on the battery.

The invention includes an article of manufacture, an apparatus, a method for making the article, and a method for using the article.

The system of the invention includes a computer system including a computer-readable medium having software to operate a computer in accordance with the invention.

Still further, the article of manufacture of the present invention comprises a computer-readable medium embodying a computer program. For the present invention, the computer-readable medium embodying the computer program comprises program modules to control a computer to perform the method of the present invention.

Further, the apparatus of the present invention comprises a computer programmed with software to operate the computer in accordance with the present invention.

Additionally, the apparatus of the present invention includes a battery monitoring and electronics module.

Moreover, the above objects and advantages of the invention are illustrative, and not exhaustive, of those that can be achieved by the invention. Thus, these and other objects and advantages of the invention will be apparent from the description herein, both as embodied herein and as modified in view of any variations that will be apparent to those skilled in the art.

BRIEF DESCRIPTION OF THE DRAWINGS

Embodiments of the invention are explained in greater detail by way of the drawings, where the same reference numerals refer to the same features.

DETAILED DESCRIPTION OF THE INVENTION

Figure 1:
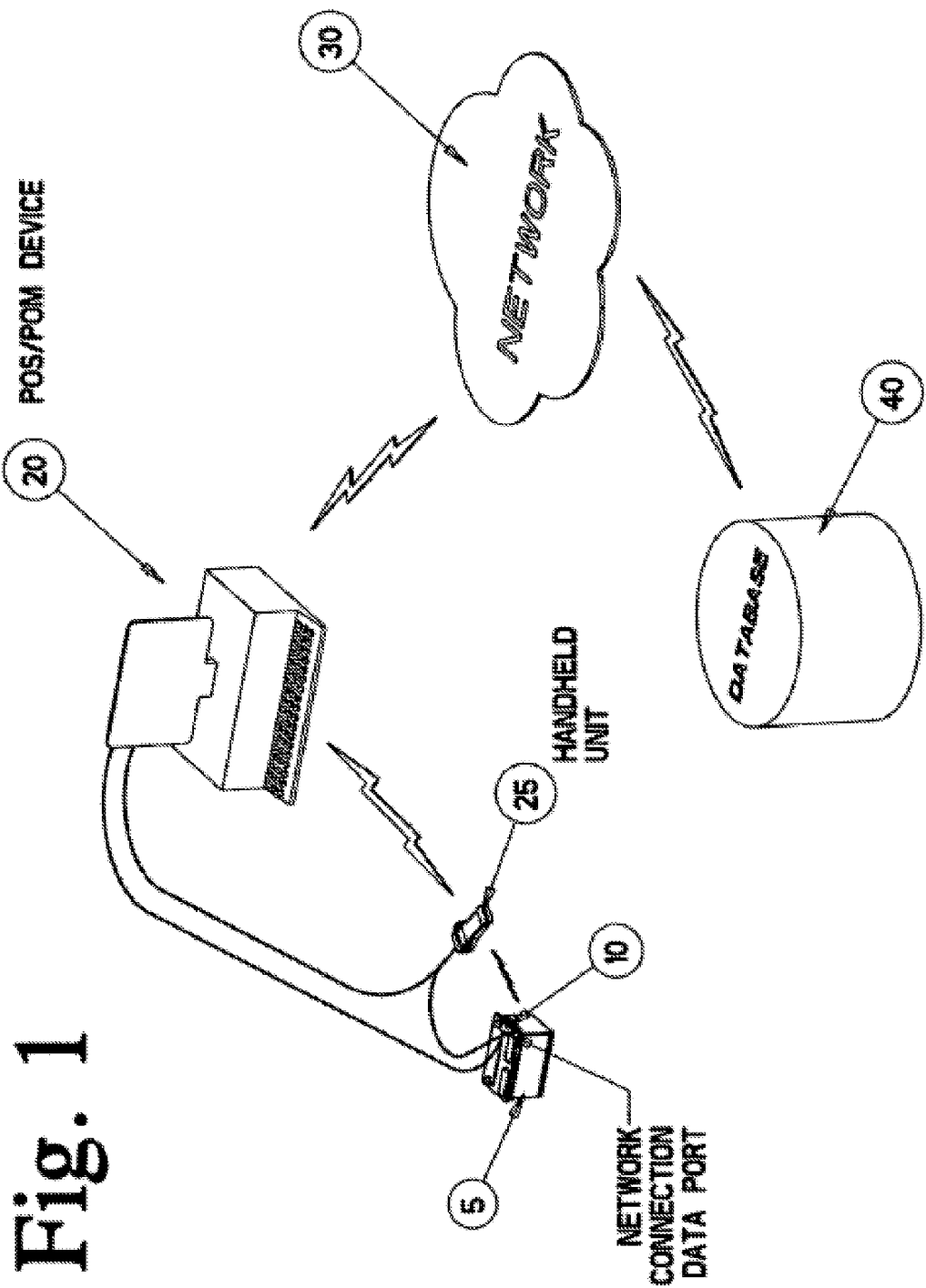
FIG. 1 illustrates a plan view of an exemplary embodiment of the invention.

In describing the invention, the following definitions are applicable throughout.

A "computer" refers to any apparatus that is capable of accepting a structured input, processing the structured input according to prescribed rules, and producing results of the processing as output. Examples of a computer include: a computer; a general purpose computer; a supercomputer; a mainframe; a super mini-computer; a mini-computer; a workstation; a micro-computer; a server; an interactive television; a hybrid combination of a computer and an interactive television; a controller processor; an ASIC; and application-specific hardware to emulate a computer and/or software. A computer can have a single processor or multiple processors, which can operate in parallel and/or not in parallel. A computer also refers to two or more computers connected together via a network for transmitting or receiving information between the computers. An example of such a computer includes a distributed computer system for processing information via computers linked by a network.

A "computer-readable medium" refers to any storage device used for storing data accessible by a computer. Examples of a computer-readable medium include: a magnetic hard disk; a floppy disk; an optical disk, such as a CD-ROM and a DVD; a magnetic tape; a memory chip; and a carrier wave used to carry computer-readable electronic data, such as those used in transmitting and receiving e-mail or in accessing a network, such as the Internet or a local area network ("LAN"); and any storage device used for storing data accessible by a computer.

A "computer system" refers to a system having a computer, where the computer comprises at least one computer and a computer-readable medium embodying software to operate the computer.

A "database" is a combination of software and hardware used to efficiently store data on an at least one information storage device, in an exemplary embodiment this includes storage on an information storage device comprising an at least one computer readable medium as defined herein.

A "handheld device" is a handheld device capable of receiving and processing data in a manner emulating a computer as defined herein.

An "information storage device" refers to an article of manufacture used to store information. An information storage device has different forms, for example, paper form and electronic form. In paper form, the information storage device includes paper printed with the information. In electronic form, the information storage device includes a computer-readable medium storing the information as software, for example, as data.

A "network" refers to a number of computers and associated devices that are connected by communication facilities. A network involves permanent connections such as cables or temporary connections such as those made through telephone or other communication links. In this way the network can be maintained by conventional wires or may also be provided wirelessly. Examples of a network include: an internet, such as the Internet; an intranet; a local area network (LAN); a wide area network (WAN); CAN and LIN networks; cellular networks; and any combination of networks, such as an internet and an intranet.

A "point of sale/point of maintenance device" refers to a network interface, a computer or handheld device that is used to interface with a network, a database, and/or with the electronics module of the battery product. This may be a single device or may be comprised of numerous component devices, such as a handheld device used in conjunction with a wireless network connection to a computer which then communicates with a network and, thereby, a database. The point of sale/point of maintenance device is located at the point of sale or point of maintenance and is coupled to the battery product.

"Software" refers to prescribed rules to operate a computer or similar device. Examples of software include: software; code segments; program modules; instructions; computer programs; and programmed logic.

Figure 2:
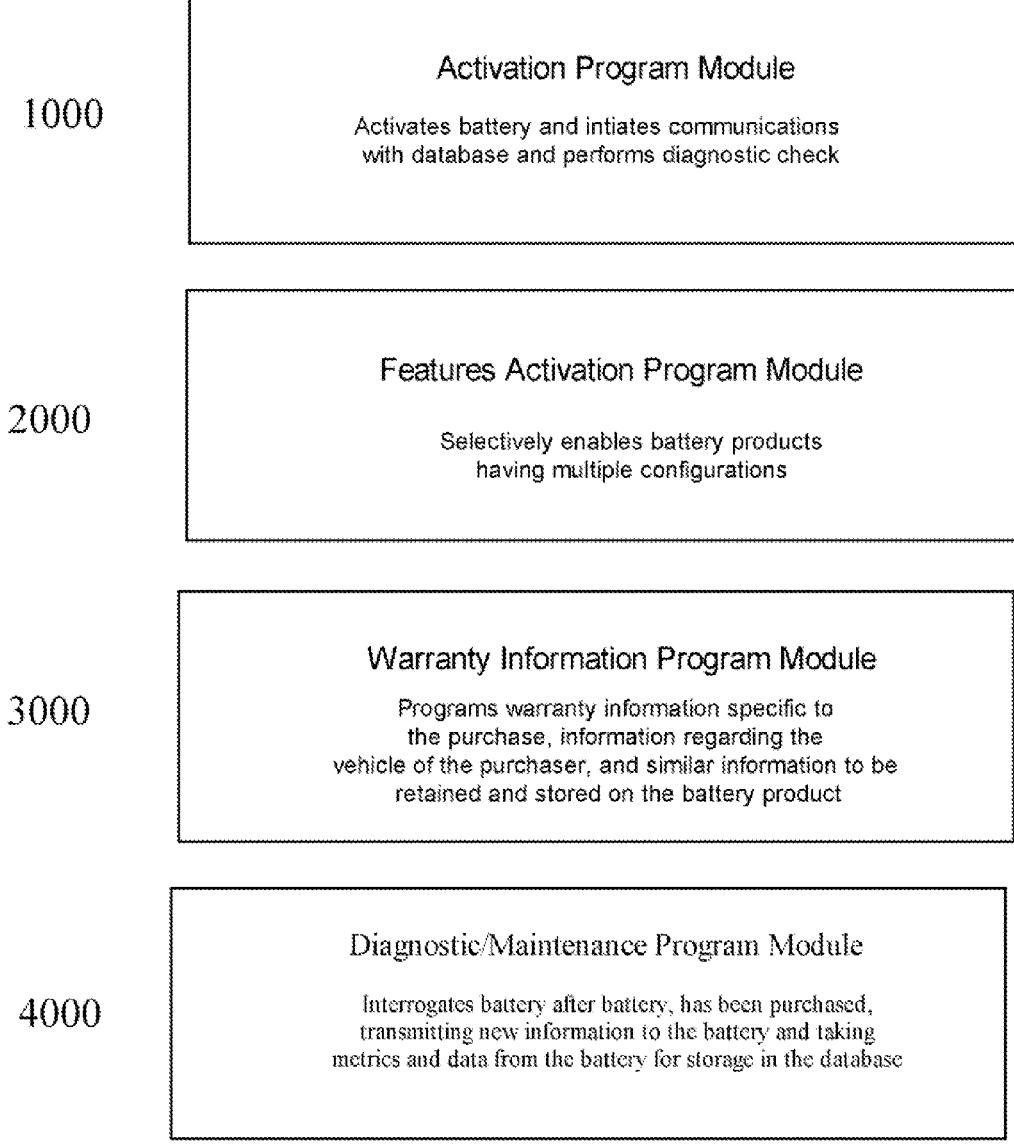
FIG. 2 illustrates the program modules of an exemplary embodiment of the instant invention.

FIG. 1 shows a plan view of the instant invention. The exemplary embodiments of FIGS. 1-2 are directed to a battery warranty and metrics tracking network with a programmable battery product also capable of storing performance data. The components of the system include at least one of an onboard electronics module 10 on the battery product 5; a point of sale/point of maintenance device 20 which provides communication with the battery product 5 and a data input for communicating data from and into the battery 25 and also communication of this data to a product database 40; and a network 30 carrying relevant data for storage in the product database 40 and data and/or instructions 50 for storage on the battery product 5 and within the database 40. Reference to a network, a database, an information storage device, a point of sale/point of maintenance device, and an electronics module is to be read as including at least one of each device that is reference to the singular includes all derivations of the plural for each feature disclosed.

The electronics module 10, the point of sale/point of maintenance device 20, network 30, and database 40 further includes at least one computer-readable medium in an information storage device embodying software for implementing the invention and/or software to operate the electronics module 10, the point of sale/point of maintenance device 20, the network 30, and database 40 in accordance with the invention. In an exemplary embodiment, the point of sale/point of maintenance device 20 would operate as a distributed network connected to servers for data storage and retrieval nationwide.

FIG. 2 shows a flow chart of the program modules used in the invention. In a first program module 1000, software for activating the battery product 5 is provided via the instant invention from the database 40 through the point of sale/point of maintenance device. The system allows for programming, activation, and configuration of the battery product 5. The battery product 5 may be any battery capable of accommodating the electronics module 10. In an exemplary embodiment the battery product 5 is a smart battery or multiple battery system having an at least one electronics module 10 thereon. The electronics module 10 maintains the battery product in dormant state. The battery is only awoken from the dormant state by interaction with the point of sale/point of maintenance device 20.

Effectively the exemplary embodiment of FIGS. 1 and 2 provides a warranty of non-use of the battery product 5 up to the point of sale, as the battery product 5 is only activated at this time. In an exemplary embodiment, this is accomplished with a point of sale/point of maintenance handheld device 22. The battery product activates at the time of sale as software is pushed from the handheld into the electronics module 5 of the battery warranty and metrics tracking system.

A further program module 2000 provides for activation of additional programmable capabilities on the battery product 5. In instances where the battery product 5 has multiple programmable configurations, the specific configuration can be activated via the point of sale/point of maintenance device 20. Software is pushed into the electronic package 5 and relevant hardware components and accessory function onboard the battery can be selectively enabled based on this software. One example of such a multiple configuration intelligent battery system or programmable battery product is applicant's INTELLICELL battery system, which can be configured for multiple feature levels as well as vehicle and geographic specific functionality. These can include, for example, but certainly are not limited to, activating specific feature rich hardware onboard the intelligent battery system, such as, but certainly not limited to, the hardware indicated in applicants co-pending U.S. patent application Ser. Nos. 10/604,703, 10/708,739 and 10/913,334, herein incorporated by reference.

Together with the software being pushed onto the battery product, in a further program module 3000, warranty information specific to the purchaser, information regarding the vehicle of the purchaser, and similar information may be retained and stored on the battery product 5 and, through the network 30, within the database 40. In an exemplary embodiment, the point of sale/point of maintenance device 20 is used to enter data into the battery product 5. The data can include, for example, identifying information for the specific battery product 5, including for instance, but certainly not limited too, the point of purchase, the date of purchase, a level of warranty, a time period of warranty, vehicle identifying information such as VIN number, vehicle make and model information, locale and geographic specific information, regional information, vehicle specific/manufacturer specific information, and other relevant information. This information, in portions or in its entirety, is stored on the battery product 5 and within the database 40.

The information is pushed to the battery product 5 regarding the point of sale/warranty data and communicated, either at the time of purchase or at a later time, to the battery warranty and metrics tracking system network allowing for the storage of battery product 5 specific data into the battery product 5 and into the database 40. The network component 30 of the battery warranty and metrics tracking system transmits this data and allows for storage of this data in the database 40 as a database of product and customer information.

In a further program module 4000, the point of sale/point of maintenance device 20 is used during maintenance or at a location where the battery product 5 is being returned to interrogate the information regarding the warranty stored in the electronics module 10. This information may be compared to the stored data within the database 40. Additionally, performance data from the battery product 5 may be retrieved and transmitted via the network to the database 40. This can include metrics regarding any of the characteristics of the battery, including voltage, amps, temperature, and similar characteristics as well as vehicle data communicated from the vehicle to the battery and event specific data that is stored based on previously stored event parameter data pushed onto the battery product 5.

The program modules function together to provide tracking of specific information about individual battery products. Each module can function independently of the others and there is no specific order of operation, however, in an exemplary embodiment of the instant invention the software embodying the invention is loaded throughout the network 30 into the point of sale/point of maintenance devices 20. During the initial sale of the battery product, the first program module or activation module 1000 is activated through the point of sale/point of maintenance device 20 to program the battery product 5. The battery product 5 is activated by the point of sale/point of maintenance device 20 activating the electronic module 10, which runs a diagnostic check of the battery and then allows for entry of sales specific programming, activation, and configuration information for the battery product 5. The activation module 1000 looks for software updates, which can be pushed from the database 40 to the point of sale/point of maintenance devices 20 for installation of the latest software in the battery product 5. With respect to the further exemplary embodiment shown in FIGS. 3-5, a similar interaction with networks can be used to update the circuit and the software utilized to operate the battery monitoring system. Likewise, the information stored on the battery product 5 is sent back to the database 40 through the point of sale/point of maintenance device 20 and the network 30 in a further step, through activation of the warranty information module 3000 as described herein below.

If appropriate, the second program module or features activation program module 2000 is activated. This module allows the point of sale/point of maintenance device 20 to selectively enable battery products 5 having multiple configurations. Depending on the desired accessories and features in the particular configuration, the battery product 5 through electronics module 10 enables the features and accessories of the particular configuration. Additional installation procedures my be required and these are noted at the point of sale/point of maintenance device 20.

After activation and initial diagnostics, a third program or warranty information program module 3000 programs warranty information specific to the purchase, information regarding the vehicle of the purchaser, and similar information to be retained and stored on the battery product 5. This information is similarly communicated through the network 30 back to the database 40. In this exemplary embodiment, the point of sale/point of maintenance device 20 is used to enter data into the battery product 5. This can be accomplished via any input device, non-limiting examples being a keyboard or touch screen. The data can include, for example, identifying information for the specific battery product 5, including for instance, but certainly not limited to, identification of the point of sale, the date of purchase, a level of warranty, a time period of warranty, vehicle identifying information such as VIN number, vehicle make and model information, locale and geographic specific information, regional information, vehicle specific/manufacturer specific information, and other relevant information. This information, in portions or in its entirety, is stored on the battery product 5 and within the database 40. The information is pushed onto the battery product 5 regarding the point of sale/warranty data and this information is then communicated, either at the time of purchase or at a later time, to the battery warranty and metrics tracking system network allowing for the storage in the database 40.

After activation and programming, the battery is fully functional and operated by the purchaser. During maintenance calls or if the battery product 5 is returned for warranty purposes, the fourth or diagnostic program module 4000 can be activated. The diagnostic module can also be used at the point of sale, if further diagnostic information is desired. The diagnostic program module is run through the point of sale/point of maintenance device 20 and communicates with the electronics module 10 of the battery through a wireless or standard wired connection (note the data port). The information obtained from the battery product 5 will report all previously stored information on the battery product 5. This information can be checked, if desired, against the records stored in database 40. Further, information collected on the battery products 5 metrics can include historical data, especially in the case of failure. This could include operational metrics and information regarding the past and current state of the battery, and this and other stored information can be retrieved. This information is communicated to the database 40 and added to the record of the battery product 5 stored thereon. Additionally, software upgrades and other relevant new information is then transmitted back to the battery product 5 from the database 40 through the network 30 and the point of sale/point of maintenance device 20. The information on the battery product 5 is thus maintained and a record of the performance of the battery product 5 and its service history are recorded.

This data warehousing on the database 40 provides manufacturers and distributors with heretofore unknown tracking and metrics capabilities. The data warehousing within the battery warranty and metrics tracking system allows distributors and manufacturers to analyze the data fields in the database 40 and make determinations and correlations regarding battery costs and performance and thereby adjust warranties accordingly. The data warehousing also enables faster recall notifications for potential service issues. Additionally, the data enables manufacturers to more clearly fit and enforce warranties based on regional zones and provides enhanced tracking for warranty claims, including data on metrics. This metrics tracking would provide for faster improvements in designs based on this data. For example, if warranty hits increased or maintenance data showed increased failures in cold weather regions, battery design could more efficiently be adjusted to improve cold weather performance.

In addition to the software, computers and networks comprising the tracking system, the electronics module 5 of the instant invention provides additional security in providing accurate data on warranties. Current process of date stamping the exterior is a thing of the past. Tampering with date stamping currently used for warranty tracking and management is easily accomplished in the current market. This leads to an increased numbers of fraudulent warranty claims. The electronics module 10 of the instant invention is developed in such a manner as to deter removal and/or tampering with this component. This is done to both prevent modification of the onboard data pushed onto the battery product and to prevent remanufacture/rehabilitation of the electronics module by unauthorized manufacturers. The methodology of rendering the electronics module tamper resistant can include, but are not limited to, electronics, tamper-resistant/evident markers, mechanical tamper indicators, tamper resistant software functionality (e.g. searching for an electrical connection or otherwise search for point of sale/point of maintenance device), firmware, or similar methodologies to deter tampering. The battery product 5 may, if tampered with, be disabled or an indicator may be provided to alert customers and maintenance personnel.

In an exemplary embodiment, the functionality of the battery product 5 would be disabled; however, access to and the integrity of the stored data will be maintained and accessible via the point of sale/point of maintenance device 20 of the instant invention. The point of sale/point of maintenance device 20 will be able to access the data from the battery product 5, either directly from the electronic module 10 or from component parts, such as, but not limited to, a secure E-PROM chip, of the electronics module 10.

Figure 3:
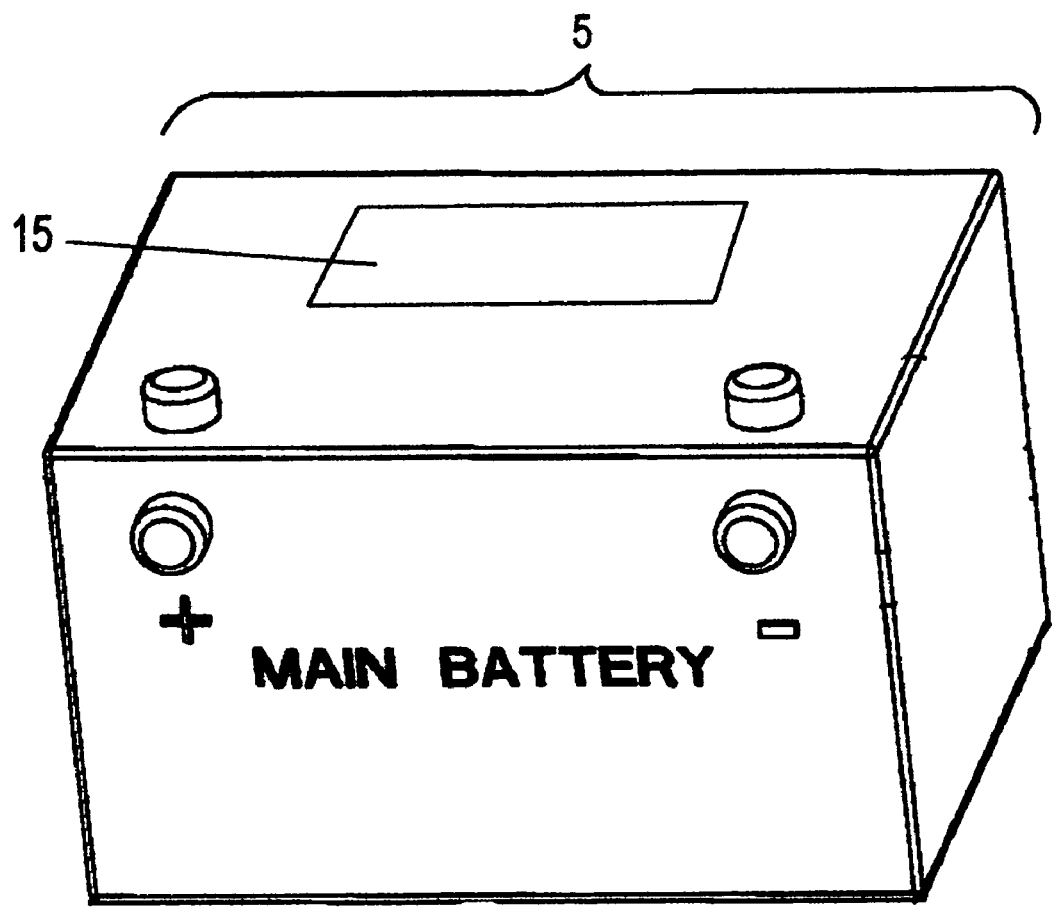
FIG. 3 illustrates a perspective view of a further exemplary embodiment of the instant invention incorporating the exemplary embodiment of the electronics battery monitoring module of the instant invention within a battery housing.

FIG. 3 illustrates a perspective view of an exemplary embodiment of the instant invention incorporating the exemplary embodiment of the battery monitoring electronics module of the instant invention within a battery housing. In addition to providing hardware, software, and networks for retrieving and monitoring the warranty information and performance characteristics, an additional embodiment that can function with the warranty tracking and monitoring software or in a stand alone capacity is included as a further exemplary embodiment of the battery monitoring system. In FIG. 3, the battery monitoring electronics package 15 is shown attached to a battery product 5. The battery product 5 may be any battery capable of accommodating the electronics module 15. In an exemplary embodiment the battery product 5 is a smart battery or multiple battery system having an at least one electronics module 15 thereon. The battery monitoring electronics package 15 may be also be incorporated outside the housing of the battery product 5, for instance as part of the electrical system of a vehicle.

Figure 4:
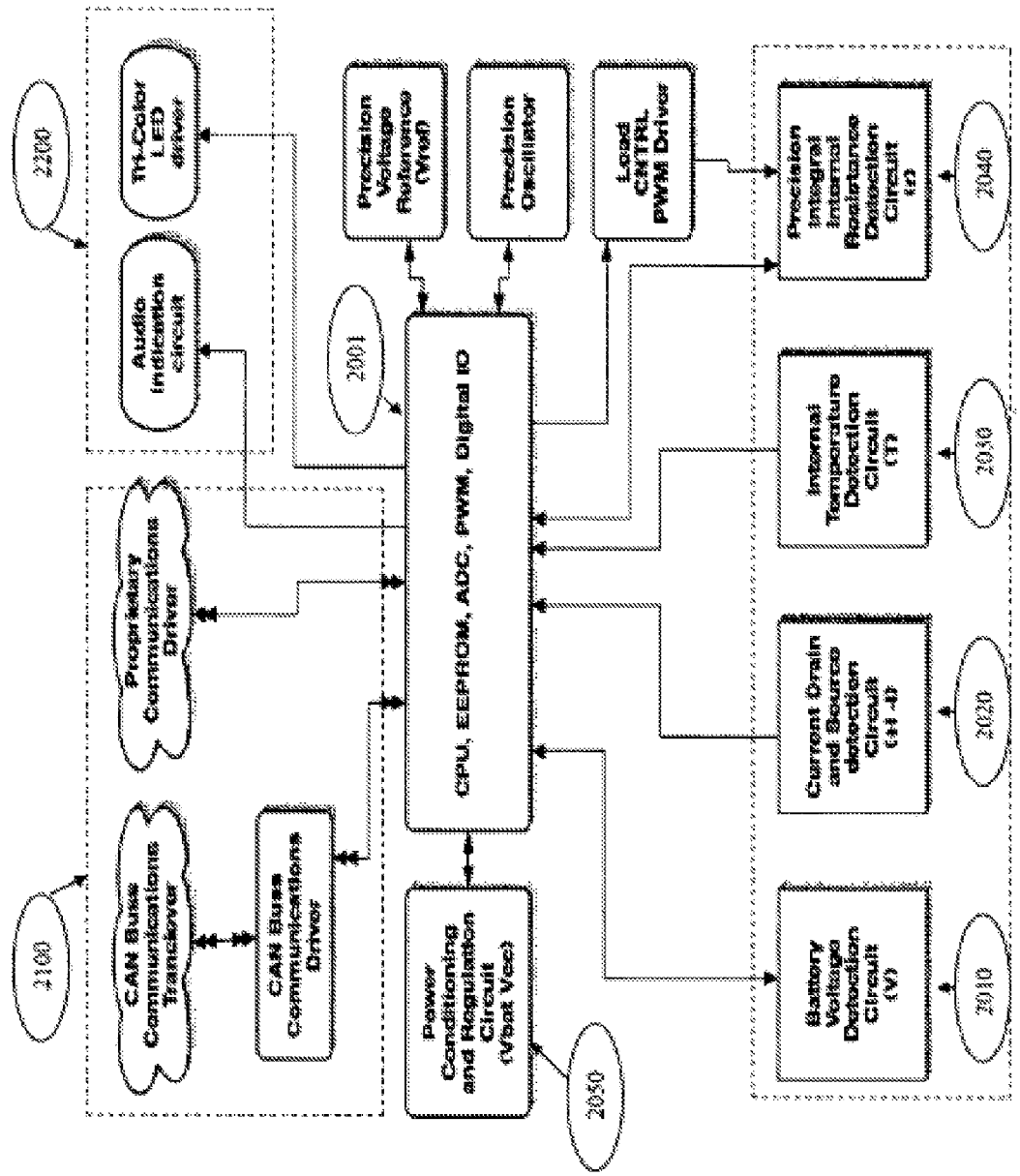
FIG. 4 illustrates a plan view of an exemplary embodiment of the electrical circuit shown in FIG. 3.

FIG. 4 illustrates a plan view of an exemplary embodiment of the electrical circuit shown in FIG. 3. The controller 2001 can incorporate a number of sub-components. These can include for instance, but not limited to, a CPU, EEPROM(s), ADC(s), PWM(s), Digital Inputs/Outputs, and similar components to enable the functionality of the controller 2001.

The controller 2001 is in communication with an at least one sensor, for instance, but not limited to, the disclosed sensor circuits 2010-2040, sensing battery parameters or battery data. The controller 2001 can measure, for example, temperature, resistivity, voltage, current, and similar variables to determine the overall health of the battery. The sensors may be incorporated in a single sensor circuit or may be provided through a group of sensors or sensor circits. In the exemplary embodiment depicted, a battery voltage detection circuit 2010, a current drain and source detection circuit 2020, an internal temperature detection circuit 2030 and an internal resistance detection circuit 2040 are provided. These sensors report the respective sensed data back to the controller 2001. In addition, a power condition and regulation circuit 2050 is used to ensure stable voltages are supplied to the detection sensors. Greater or fewer circuits can be provided to measure these or other variables within the battery.

The sensed battery parameter(s) or battery data is collected by the controller and may be used immediately or may be stored in memory for later use. The data can be compared to thresholds, stored in the controller, and adjusted for the type and size of the battery. The software regarding thresholds and analysis may be pre-programmed on the battery or downloaded to the battery at the point of purchase along with relevant purchase specific information. The controller 2001 can communicate and send an alert signal via a network, computer, or a wireless device through the communications protocols/devices 2100 or via an at least one indicator element 2200, shown in the exemplary embodiment but certainly not limited to, an audio indication circuit or a tri-color LED driver. If the monitored values exceed the preset thresholds a warning may be triggered in real time.

Additionally or alternatively, the data may be used in a predictive model to predict, based on captured data or stored data, when a warning to change the battery should be sent. This predictive value can be adjusted in real time as the battery monitors the variables. The predictive model may be adjusted via a network, wireless device, or via an indicator element. This analysis, both with respect to real time analysis and predictive analysis is described further below in relation to the flow diagram shown as FIG. 5.

Figure 5:
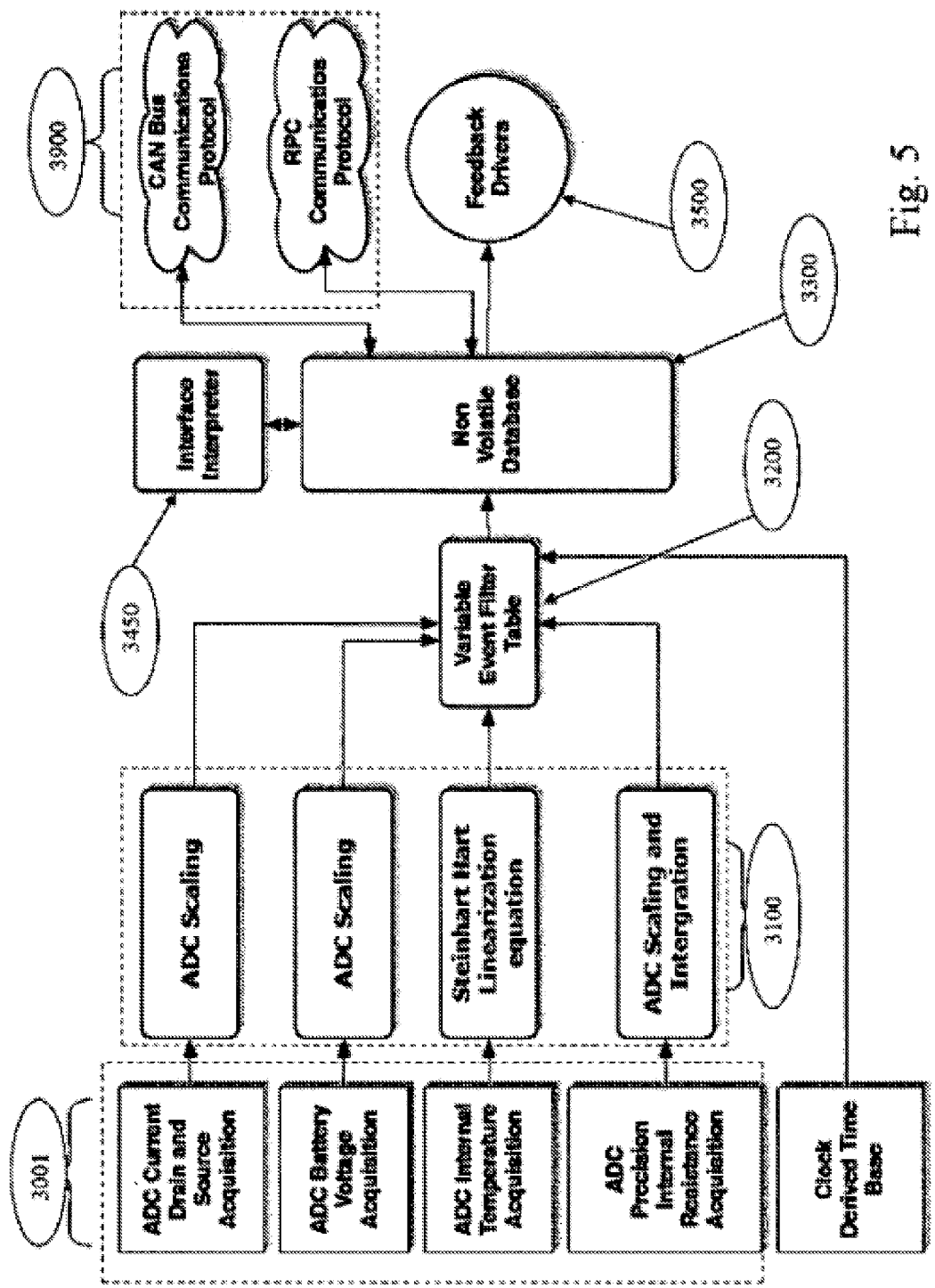
FIG. 5 illustrates a flow diagram of an exemplary embodiment of a method of operation of the battery monitoring system.

FIG. 5 illustrates a flow diagram of an exemplary embodiment of a method of operation of the battery monitoring system. In a first step 3001, the battery monitor acquires battery parameter(s) or battery data from sensors. In the exemplary embodiment shown, this step includes at least one of the boxed sub-steps of acquiring analog to digital converted data for current drain and source, voltage acquisition, internal temperature, internal resistance, and similar parameters or data.

This information is processed in the further step 3100 of filtering and processing the parameters and data. This processing can include, as show in the exemplary embodiment, sub-steps which can include but are not limited to ADC scaling and integration of variables, Steinhart Hart Linearization, and other modifications to the parameters or data. The modified data is passed onto the further step of analyzing the data 3200.

In the analyzing step 3200, the modified data is passed through a filter applying a predictive, parametric database of values. Essentially this is represented in the exemplary embodiment by the variable event filter table, a table or map with a wide number of combinations of the sensed variables resulting in an output that represents the state of the battery or the relative health of the battery with respect to its operating life. The parameters or data can be stored in memory or the state of the battery may be stored in memory in step 3300. Additionally or alternatively, the information or data may be transmitted via the optional step of communicating 3900 through, for example, a communication protocol and network, wired or wireless, or communicating through an interface to other components in a further communicating step 3450. It should be noted that the optional communications steps may also be used to update the thresholds and tables used in analyzing step 3200 that is the communication can be bi-directional to facilitate updates. This updating may be done through a network or a handheld device at the time of purchase or during maintenance or during operation of the battery, as disclosed previously.

Finally, in a further feedback and updating step 3500, the information from the database can be fed to feedback drivers for further updating and correction of the thresholds and tables used in the analyzing step. This is a self-teaching, self-correcting measure to allow the battery monitoring unit to make changes for the specific battery with which it is associated.

The embodiments and examples discussed herein are non-limiting examples. The invention is described in detail with respect to exemplary embodiments, and it will now be apparent from the foregoing to those skilled in the art that changes and modifications may be made without departing from the invention in its broader aspects, and the invention, therefore, as defined in the claims is intended to cover all such changes and modifications as fall within the true spirit of the invention.

What is claimed is:

1. A method of operating a vehicle battery monitoring system in communication with a vehicle battery product, the method comprising:

waking the battery monitoring system from a dormant state;

transmitting and receiving information regarding the vehicle battery product and updating said information based on initial data input by a user;

sensing at least a battery product voltage and a battery product temperature;

acquiring battery product data from the battery product voltage and the battery product temperature;

filtering the acquired battery product data into modified battery product data including passing the modified battery product data through a filter code segment and a predictive code segment acting on a predictive, parametric database of values and processing the modified battery product data against stored parameters through a lookup function on a variable event filter table resulting in an output that represents the state of charge or state of health of the battery;

storing the acquired, filtered, modified and compared battery product data in the portion of memory and retaining whole or in part the acquired, filtered, modified and compared battery product data to provide historical battery product data over the course of the life of the battery product;

comparing the stored battery product data against threshold levels;

analyzing the stored battery product data when threshold levels are met; and determining a state of the battery based on the analyzing step and reporting same.

2. A vehicle battery product, the vehicle battery product being coupled to a battery monitoring system, the battery product and monitoring system comprising:

at least one sensor coupled to and communicating with the battery product and the battery monitoring system, the at least one sensor measuring at least a battery product voltage and a battery product temperature;

at least one communication interface for facilitating communication with one or more external devices;

a battery monitoring electronics module coupled to the at least one communication interface, the electronics module including at least one controller with at least one of an at least one CPU, EEPROM(s), ADC(s), PWM(s), Digital Input(s), and Digital Output(s) and including a portion of memory for storage of data and software operable in accordance with the software, the software having multiple code segments forming the software on the controller, the software segments including:

an at least one code segment acquiring battery product data for at least the battery product voltage and the battery product internal temperature from the at least one sensor;

an at least one code segment filtering the acquired battery product data into modified battery product data including a code segment that utilizes the modified battery product data and passes it through a filter code segment and a predictive code segment acting on a parametric database of values and processing the modified battery product data against stored parameters, the code segments including a lookup function on a variable event filter table resulting in an output that represents the state of charge or state of health of the battery;

an at least one code segment storing the acquired, filtered, modified and compared battery product data in the portion of memory and retaining whole or in part the acquired, filtered, modified and compared battery product data to provide historical battery product data over the course of the life of the battery;

an at least one code segment comparing the stored battery product data against threshold levels; and one or more external devices, wherein if the at least one code segment comparing the stored battery product data against threshold levels determines that data is beyond those levels, it sends an alert via the communications interface to a user on the one or more external devices.

3. The vehicle battery product and battery monitoring system of claim 2, wherein the stored battery product data can also include warranty-related information.

4. The vehicle battery product and battery monitoring system of claim 3, wherein the warranty information includes at least one of identification of a point of sale, a date of purchase, a level of warranty, a time period of warranty, vehicle identifying information for a vehicle in which the battery is installed, and geographic information indicating a locale in which the battery is located.

5. The vehicle battery product and battery monitoring system of claim 2, wherein the electronics module is further operable to initially maintain the battery in a dormant state and to activate the battery from the dormant state responsive to interaction with the external device, and wherein the electronics module receives the set of software via the at least one communication interface subsequent to activation of the battery.

6. The vehicle battery product and battery monitoring system of claim 2, further comprising a battery product housing, the battery product housing containing the vehicle battery product.

7. The vehicle battery product and battery monitoring system of claim 6, wherein the electronics module is within or on top of the battery housing within the vehicle.

8. The vehicle battery product and battery monitoring system of claim 6, wherein the electronics module is remote from the battery product within the vehicle.

9. The vehicle battery product and battery monitoring system of claim 2, wherein the at least one filtering and processing code segment further comprises segments performing ADC scaling and integration of variables and Steinhart Hart Linearization on the battery product data acquired by the acquiring segment resulting in modified battery product data.

10. The vehicle battery product and battery monitoring system claim 2, wherein the at least one sensor is a single sensor circuit or a group of sensors coupled to a single sensor circuit.

11. The vehicle battery product and battery monitoring system claim 2, wherein the at least one sensor is a group of sensors or a group of sensor circuits.

12. The vehicle battery product and battery monitoring system of claim 2, wherein the at least one sensor also measures a battery product resistivity and a battery product current.

13. The vehicle battery product and battery monitoring system of claim 2, wherein the battery monitoring electronics module further comprises at least one of an at least one battery voltage detection circuit, a current drain and source detection circuit, an internal temperature detection circuit and an internal resistance detection circuit in communication with the at least one sensor and communicating measured battery product data to the controller code segments and storing the measured battery product data in the portion of memory.

14. The vehicle battery product and battery monitoring system of claim 2, wherein the battery product monitoring electronics module further comprises an at least one power condition and regulation circuit used to ensure that stable voltages are supplied to the at least one sensor.

15. The vehicle battery product and battery monitoring system of claim 2, wherein the software code segment that utilizes the modified battery product data further comprises an at least one adjustment code segment that adjusts the data for the type and size of the battery.

16. The vehicle battery product and battery monitoring system of claim 2, wherein the one or more external devices have an at least one indicator element.

17. The vehicle battery product and battery monitoring system of claim 16, wherein the one or more external devices have an at least one indicator element includes an audio indication circuit or a tri-color LED driver.

* * * * *